US005458500A

United States Patent [19]
Aikawa

[11] Patent Number: 5,458,500
[45] Date of Patent: Oct. 17, 1995

[54] PROBE TESTER FOR ELECTRICAL CONNECTOR ASSEMBLY

[75] Inventor: Jiro Aikawa, Shizuoka, Japan

[73] Assignee: Yazaki Corporation, Japan

[21] Appl. No.: 238,654

[22] Filed: May 5, 1994

[30] Foreign Application Priority Data

May 7, 1993 [JP] Japan ................. 5-023576 U

[51] Int. Cl.$^6$ ................................. H01R 13/62
[52] U.S. Cl. ........................... 439/310; 439/482
[58] Field of Search ................. 439/188, 310, 439/372, 482, 700, 824; 324/72.5, 752

[56] References Cited

U.S. PATENT DOCUMENTS

| | | | |
|---|---|---|---|
| 4,716,365 | 12/1987 | Pool | 439/482 X |
| 4,773,877 | 9/1988 | Kruger et al. | 439/482 |
| 5,225,773 | 7/1993 | Richards | 439/482 X |
| 5,226,827 | 7/1993 | Corcoles et al. | 439/482 X |

FOREIGN PATENT DOCUMENTS

| | | |
|---|---|---|
| 55-8221 | 2/1980 | Japan . |
| 63-115761 | 7/1988 | Japan . |
| 4-40669 | 7/1992 | Japan . |

Primary Examiner—Khiem Nguyen
Attorney, Agent, or Firm—Wigman, Cohen, Leitner & Myers

[57] ABSTRACT

Disclosed is a tester for testing a connector provided with at least one axial terminal hole and at least one terminal which is correspondingly fitted into said at least one terminal hole, the tester having at least one probe unit which is moved with a movable body and adapted for corresponding introduction into said at least one terminal hole for testing fitting of the terminal. The probe unit comprises: a tubular case fixed to the movable body; a movable probe and a fixed probe being made of an electrically conductive material and being aligned inside the tubular case, the fixed probe being fixed to the tubular case and insulated from the tubular case and adapted for connecting to an output line, and the movable probe being slidably supported by the tubular case so as to move in an axial direction of the tubular case relative to the tubular case to connect to and disconnect from the fixed probe; and a regulator for regulating the movable probe to disconnect from the fixed probe when the corresponding terminal is not so firmly fitted to the corresponding terminal hole as fitting of the corresponding terminal can be sustained against a predetermined magnitude of force. The tubular case is integrally formed with a support portion and made of a synthetic resin such as polyacetal or fluorine plastics and having a kinetic coefficient of friction which is less than or equal to 0.15.

20 Claims, 4 Drawing Sheets

PROBE TESTER FOR ELECTRICAL CONNECTOR ASSEMBLY

BACKGROUND OF THE INVENTION

1. Field of the Invention

The present invention relates to improvement of a probe tester for testing electrical connector assemblies comprising a male connector and a female connector, as to whether the electrical terminals are firmly fitted to the male connector so that electrical connection can be suitably made by insertion of the male connector into the female connector.

2. Description of the Prior Art

In the field of electrical connector assemblies, there are two examinations to subject to the connector assemblies to which electric terminals with wires have been fitted, before application to various use, for testing the terminals. In one examination, the electrical terminals are tested as to whether the electrical terminal has been firmly fitted to inside of the connector housing, and in the other examination, tested as to whether electrical connection can be suitably made by insertion of the male connector into the female connector.

As a means for performing the above examinations at one time, a testing device has been suggested in Japanese Laid-Open Utility Model application No.(Kokai) S63-115761, which is also shown in FIGS. 1 and 2 of the present application. The conventional testing device 1 of FIG. 1 has a holder 3 and a plurality of probe units 5 each of which is inserted into each of holes 7 of the holder 3 and projects from the holder 3. As shown in FIG. 2, each of the probe units 5 has a tubular body 9 made of metal, a metallic fixed terminal 11 being fixedly supported by a insulator 13 in the tubular body 9 at one side of the tubular body 9, and a metallic movable terminal 15 is arranged in the tubular body 9, opposing the fixed terminal 11. At the opposite end to the fixed terminal 11, a bearing portion 17 is integrally formed on the end of the tubular body 9, and a plunger 19 extending from a flange portion 21 of the movable terminal 15 passes through the bearing portion 17. Moreover, a spacer 23 is fixed to the tubular body 9 and a spring 25 is disposed between the spacer 23 and the flange portion 21 so as to force the flange portion 21 toward the left side of the tubular body 9.

For examination of a connector 27, a wire 29 extending from the fixed terminal 11 and a wire 31 extending from electric terminal 33 are connected to an electric tester 35, as shown in FIG. 1. In this condition, if the plunger 19 is inserted into the corresponding engaging hole 37 of the connector 27 by coupling the connector 27 and the testing device 1, the tip end of the plunger 19 abuts on the electric terminal 33 in the hole 37. By further insertion, the plunger 19 with the movable terminal 15 are pushed by the electric terminal 33 against the spring 25 and is moved to the fixed terminal 11. Then, the movable terminal 15 contacts with the fixed terminal 11. At this time, whether the electric terminal 33 is in a connected condition or not can be determine by indication of the electric tester 35.

In the above-described testing device 1, manufacturing and machining of the tubular body, in particular, formation of the narrow hole 39 through which the plunger 19 penetrates the bearing portion 17, basically, is not very easy and production cost may be expensive. In addition to this, the above testing device 1 has disadvantages as follows:

1) since the inner bore of the tubular body 9 is thin and elongated, the process of inserting the insulator 13 into the tubular body 9 to locate it on the predetermined position and adhering it on that position by means of caulking or the like are rather troublesome and inefficient;

2) if a spacer 23 having an eccentric bore due to manufacturing trouble or the like is used for the testing device 1, such a spacer 23 may hinder smooth and easy movement of the movable terminal 15 and the plunger 19; and 3) when the movable terminal 15 and the plunger 19 slide on the bearing portion 17 of the tubular body 9 and on the spacer 23, the frictional resistance between them is large and fine powdered metal is produced by the abrasion between them, because the movable terminal 15, the plunger 19, the tubular body 9 and the spacer 23 are made of metal.

The fine powdered metal mentioned in the item 3) makes further advance of abrasion between the above members, and it also makes difficult the movement of the plunger 19 and the movable terminal 15. Moreover, if the produced metal powder is attached to the contact faces 41 and 43 of the fixed terminal 11 and the movable terminal 19, it increase the electric resistance between the contact faces 41 and 43.

SUMMARY OF THE INVENTION

The present invention has been accomplished to solve the above mentioned problems.

Therefore, it is an object of the present invention to provide a probe tester for testing electrical connector assemblies, in which exact manufacturing thereof can be easily realized.

Another object of the present invention is to provide a probe tester for testing electrical connector assemblies, in which exactness and smoothness of the testing operation can be maintained for a long time.

In order to accomplish the above-described object, the tester for testing a connector provided with at least one axial terminal hole and at least one terminal which is correspondingly fitted into said at least one terminal hole, according to the present invention, comprises: at least one probe unit which is moved with a movable body and adapted for corresponding introduction into said at least one terminal hole for testing fitting of the terminal, one probe unit in said at least one probe unit comprising: a tubular case fixed to the movable body; a movable probe arid a fixed probe being made of an electrically conductive material and being aligned inside the tubular case, the fixed probe being fixed to the tubular case and insulated from the tubular case and adapted for connecting to an output line, and the movable probe being slidably supported by the tubular case so as to move in an axial direction of the tubular case relative to the tubular case to connect to and disconnect from the fixed probe; and a regulator for regulating the movable probe to disconnect from the fixed probe when the corresponding terminal is not so firmly fitted to the corresponding terminal hole as fitting of the corresponding terminal can be sustained against a predetermined magnitude of force, wherein the tubular case is made of a synthetic resin material selected from the group consisting of polyacetal and fluorine plastics.

Another tester for testing a connector provided with at least one axial terminal hole and at least one terminal which is correspondingly fitted into said at least one terminal hole, according to the present invention, comprises: at least one probe unit which is moved with a movable body and adapted for corresponding introduction into said at least one terminal hole for testing fitting of the terminal, one probe unit in said at least one probe unit comprising: a tubular case fixed to the movable body; a movable probe and a fixed probe being made of an electrically conductive material and being aligned inside the tubular case, the fixed probe being fixed to the tubular case and insulated from the tubular case and adapted for connecting to an output line, and the movable probe being slidably supported by the tubular case so as to move in an axial direction of the tubular case relative to the tubular case to connect to and disconnect from the fixed probe; and a regulator for regulating the movable probe to disconnect from the fixed probe when the corresponding terminal is not so firmly fitted to the corresponding terminal hole as fitting of the corresponding terminal can be sustained against a predetermined magnitude of force, wherein the tubular case is made of a synthetic resin material such that the value of kinetic coefficient of friction is less than or equal to 0.15, and the value of Rockwell hardness is more than or equal to 32.5.

Another tester for testing a connector provided with at least one axial terminal hole and at least one terminal which is correspondingly fitted into said at least one terminal hole, according to the present invention, comprises: at least one probe unit which is moved with a movable body and adapted for corresponding introduction into said at least one terminal hole for testing fitting of the terminal, one probe unit in said at least one probe unit comprising: a tubular case fixed to the movable body; a movable probe and a fixed probe being made of an electrically conductive material and being aligned inside the tubular case, the fixed probe being fixed to the tubular case and insulated from the tubular case and adapted for connecting to an output line, and the movable probe being slidably supported by the tubular case so as to move in an axial direction of the tubular case relative to the tubular case to connect to and disconnect from the fixed probe; and a regulator for regulating the movable probe to disconnect from the fixed probe when the corresponding terminal is not so firmly fitted to the corresponding terminal hole as fitting of the corresponding terminal can be sustained against a predetermined magnitude of force, wherein the tubular case has a support portion being integrally formed with the tubular case inside the tubular case, the support portion has a coaxial hole which is narrower than an inner bore of the tubular case, and the movable probe is slidably supported on the coaxial hole.

According to the construction mentioned above, troublesome machining steps are not required for manufacturing the tester, because the support portion is integrally formed with the tubular case by using resin material. Therefore, production costs are reduced. Moreover, there are fewer variations in the manufactured support portions, because the support portion is integrally molded. This results in low frictional resistance during sliding operation and high durability. In addition, there is no abrasive powder produced by the support portion. Therefore, smooth sliding is realized and electric resistance of the tester is maintained.

BRIEF DESCRIPTION OF THE DRAWINGS

The features and advantages of the probe tester for testing a connector according to the present invention will be more clearly understood from the following description of the preferred embodiments of the present invention taken in conjunction with the accompanying drawings in which identical reference numerals designate the same or similar elements or sections throughout the figures thereof and in which.

DESCRIPTION OF THE PREFERRED EMBODIMENT

Now, an embodiment of the probe tester according to the present invention will be described hereinafter.

Figure 1:
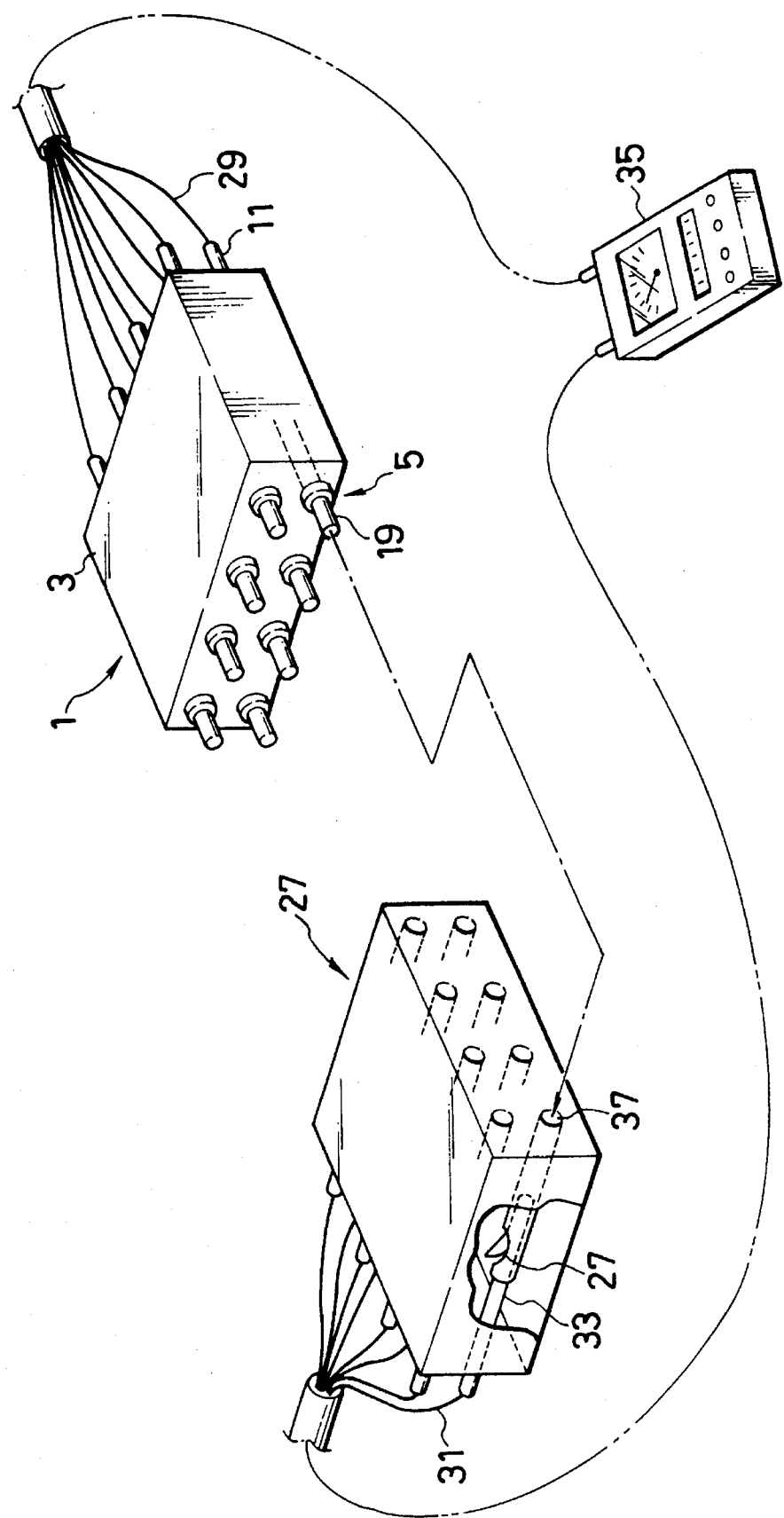
FIG. 1 is a perspective view of a conventional testing device.
Figure 2:
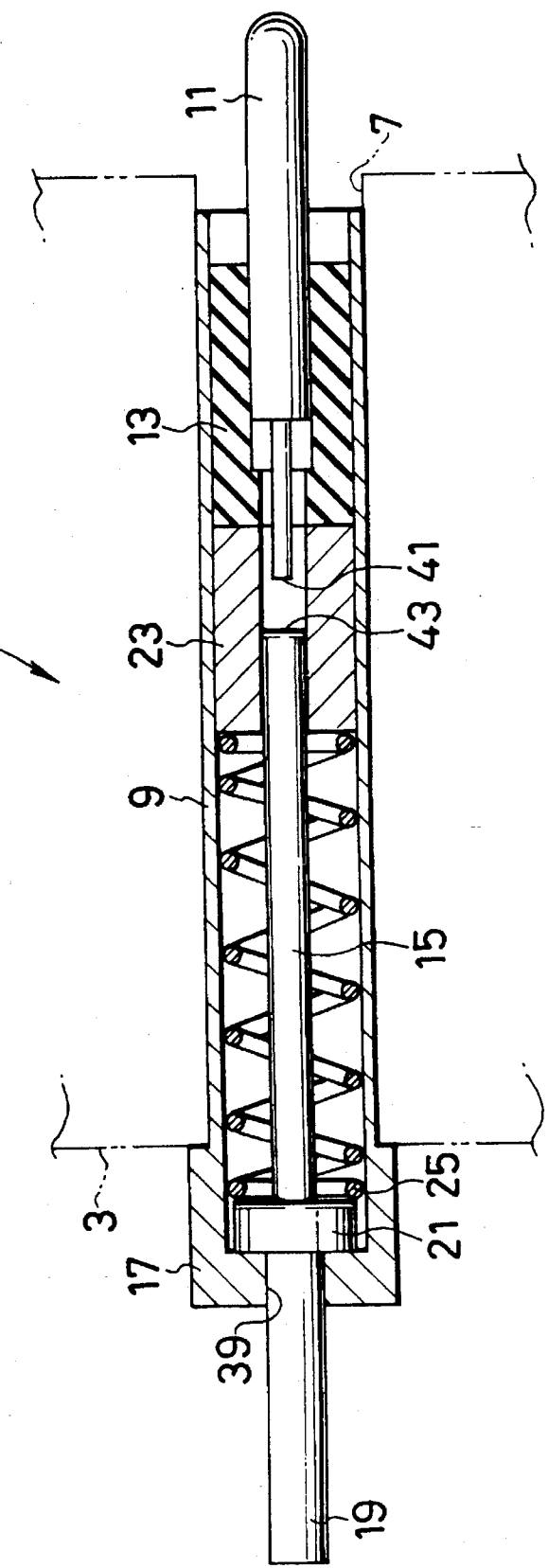
FIG. 2 is a sectional view of a probe unit of the conventional testing device shown in FIG. 1.
Figure 3:
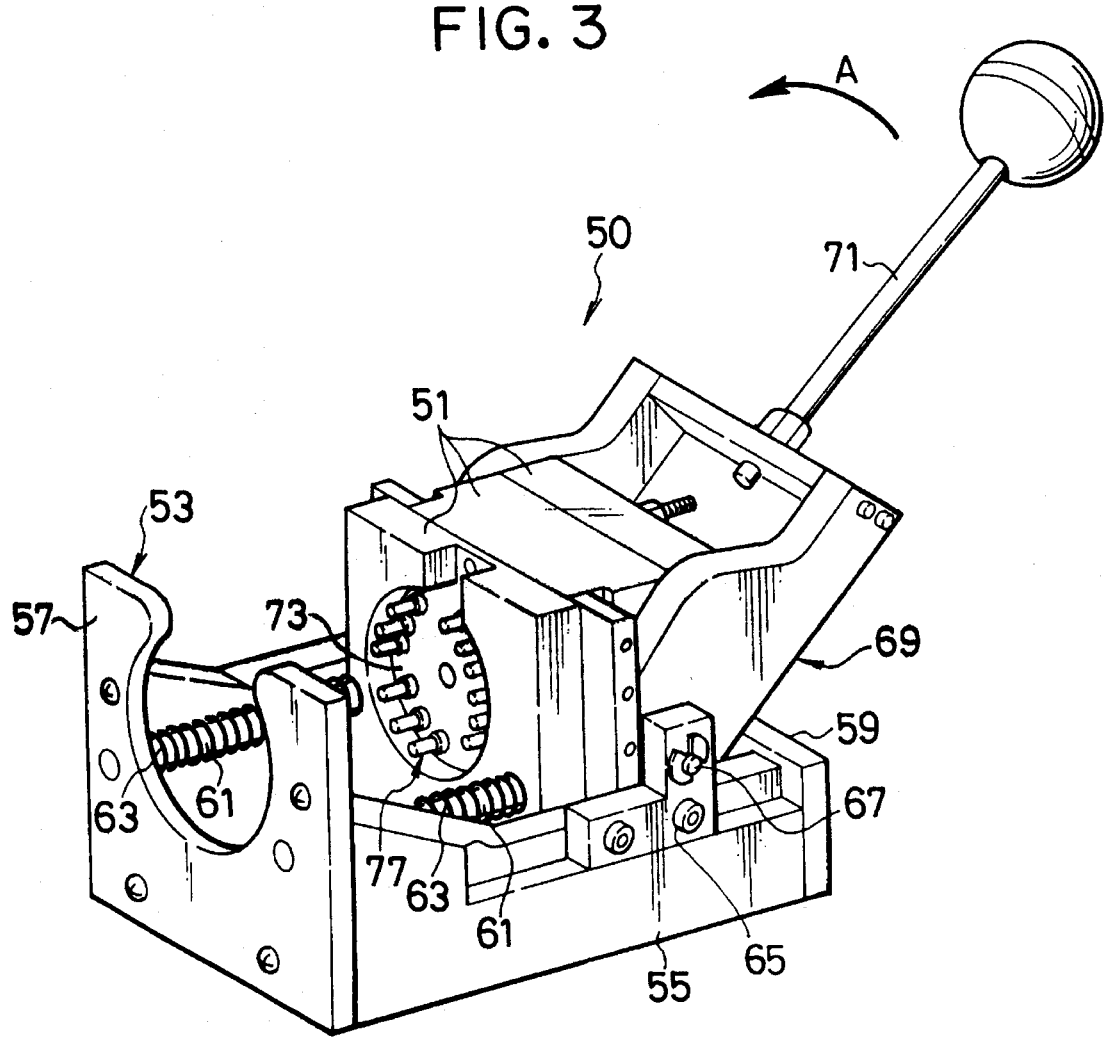
FIG. 3 is a perspective view of the probe tester according to the present invention.

FIG. 3 shows a probe tester 50 according to the present invention. The probe tester 50 comprises a movable tester body 51 and a connector receiver 53 for receiving a connector (not shown) and for positioning the connector to be tested on a predetermined position. The connector receiver 53 has a base 55 having a rectangular bottom face, and a support wall 57 and a fixing plate 59 are fixed to opposite ends of the base 55, respectively, opposing each other. Both the support wall 57 and the fixing plate 59 stand perpendicular to the base 55. A pair of slide shafts 61 are horizontally arranged between the support wall 57 and the fixing plate 59 in parallel to each other, and both ends of each of the shafts 61 are firmly fixed to the support wall 57 and the fixing plate 59. On the other hand, the tester body 51, which has a pair of parallel through holes, is mounted on the base 55 and each of the slide shafts 61 passes through each of the through holes of the tester body 51, respectively, so that the tester body 51 can slide on the base 55 between the support wall 57 and the fixing plate 59 in a horizontal direction along the shafts 61. Moreover, a pair of coil springs 63 are arranged between the support wall 57 and the tester body 51 so as to surround the shafts 61, respectively. As a result, the tester body 51 is normally forced toward the fixing plate 59 by the springs 63.

A pair of brackets 65 are fixed to both sides of the base 55, and an axle 67 extends in parallel to the support wall 57. Each of the ends of the axle 67 is rotatably supported by the brackets 65. Moreover, a cam device 69 including a pair of cam plates and a connecting plate therebetween is coupled to the axle 67 so as to rotate with respect to the axle 67. For easily moving the cam device 69, a handle 71 with a grip ball is connected to the upper end of the cam device 69 to extend radially. If the handle 71 is rotated, centered around the axle 67, in the direction depicted by an arrow A in FIG. 3, the cam device 69 rotates and the tester body 51 is pushed against the springs 63 toward the support wall 57 in accordance with rotation of the cam device 69.

Figure 4:
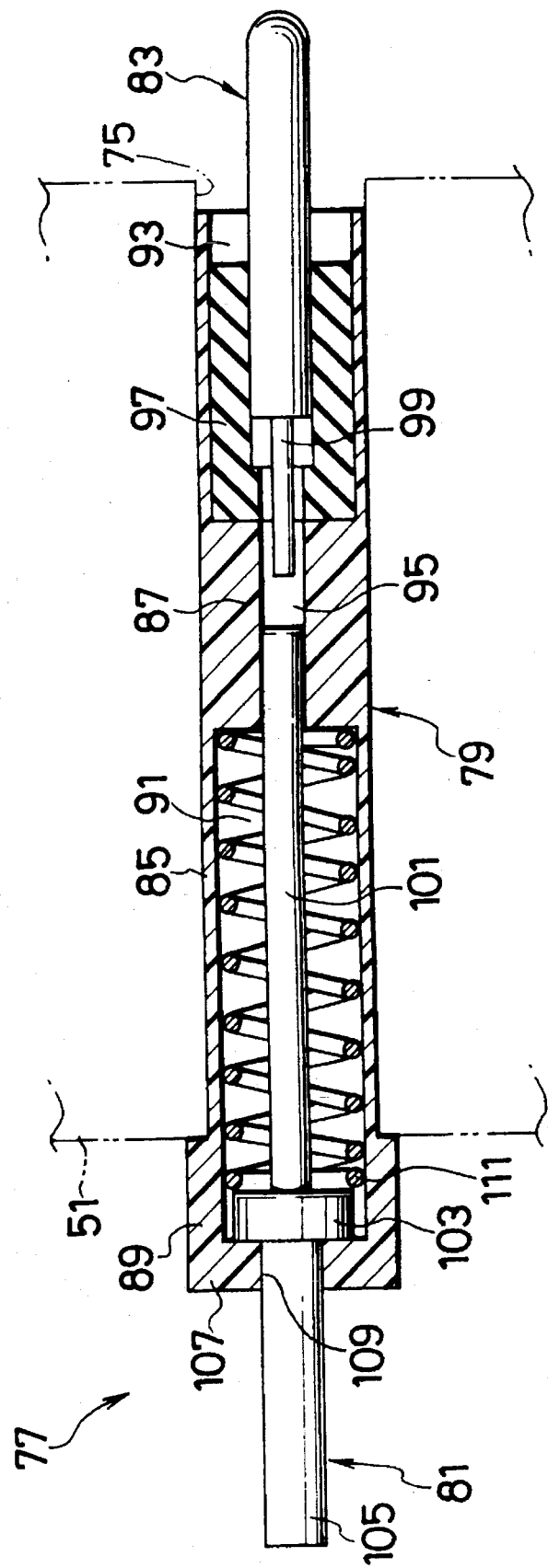
FIG. 4 is a sectional view of a probe unit of the probe tester shown in FIG. 4.

A cylindrical recess 73 is formed on the front surface (the left side surface in FIG. 3) of the tester body 51, facing to the support wall 57, and a circular cut is formed on the upper edge of the support wall 57. A plurality of cylindrical holes 75 pass through the tester body 51 from the recess 73 to the rear side of the tester body 51 in parallel to the shafts 61. In each of the holes 75 inserted and fixed is a probe unit 77, respectively, as shown in FIG. 4.

Each probe unit 77 comprises a cylindrical body 79, a front probe 81 and a rear probe 83.

The cylindrical body 79 includes a tubular portion 85, a spacer portion 87 and a flange portion 89. The flange portion 85 is integrally formed on the forward end (at the left side in FIG. 4) of the tubular portion 85. The outer diameter of the flange portion 89 is slightly larger than that of the hole 75 so as to prevent the flange portion 89 from being inserted into the hole 75. The spacer portion 87 is integrally formed on the inner bore in the vicinity of the center of the tubular portion 85 and radially inwardly protrudes from the tubular portion 85. As a result, the inner bore of the tubular portion 85 is separated by the spacer portion 87 into a first inner bore 91 and second inner bore 93 which are coaxial with each other and have the same size diameter. An axial hole 95 passes through the center of the spacer portion 87 in the axial direction to communicate the first bore 91 and the second bore 93. In the second inner bore 93, a ring 97 made of a insulating resin material is fixed to the rear face of the spacer portion 87 and the bore surface of the second inner bore 93.

The rear probe 83 having a pin terminal 99 passes through the ring 97 in the axial direction and the pin terminal is axially slidably supported on the rear probe and biased forwards by a spring (not shown) which is incorporated in the rear probe 83.

On the other hand, the front probe 81 is composed of a pin terminal 101, a flange portion 103 and a front portion 105 being coaxially connected to the pin terminal 101 via the flange portion 103. The flange portion 89 has a bearing portion 107 with a bearing bore 109. The bearing bore 109 axially passes through the bearing portion 107. The front portion 105 is supported at the bearing bore 109, and the tip end of the pin terminal 105 is inserted into the axial hole 95 and slidably supported by the spacer portion 87. The bearing bore 109 has a diametrical size which is smaller than that of the inner bore of the tubular portion 85 and which is approximately the same as that of the front portion 105. Moreover, the diametrical size of the axial hole 95 of the spacer portion 87 is approximately same as that of the pin terminal 101. Therefore, the front probe 81 can slide in the axial direction. In addition, a biasing device, namely, a spring 111 is disposed between the spacer portion 87 and the flange portion 103 and surrounds the pin terminal 101. As a result, the flange portion 103 of the front probe 81 is forced to the bearing portion 107.

Next, operation of the above-described probe tester for testing a connector will be illustrated. Prior to the operation, an electric tester (not shown) is electrically connected with the terminal of the connector and the rear probe 83 of the probe tester. Then, the testing operation is started.

Referring again to FIG. 3, a connector to be tested (not shown) is first placed in the space between the support wall 57 and the tester body 51, facing to the tester body 51. Next, the handle 71 is rotated in the direction A. In response to this motion, the tester body 51 with the probe units 77 is pushed to the connector to be tested, and the connector is fitted in the recess 73 of the tester body 51 at one side thereof, contacting on the support wall 57 at the opposite side, so that each of the front probes 81 is inserted into the corresponding terminal hole of the connector. The front probe 81 then abuts on the corresponding terminal of the connector. If the tester body 51 is further pushed, the front probe 81 is pushed by the electric terminal into the tubular portion 85 against the spring 111. As a result, the pin terminal 101 of the front probe 81 contacts with the pin terminal 99 of the rear probe 83, therefor the terminal of the connector is electrically connected to the rear terminal 83 through the front probe 81, provided that the terminal is normally fitted to the connector. At this time, since a closed circuit is made among the connector, the probe tester and the electric tester, the electric tester indicates the value of electric flow therethrough. Therefore, whether the electric terminal is firmly fitted to the connector or not can be known in accordance with the indication of electric flow on the electric tester.

According to the above construction, it is of course possible to examine the fitting of the electric terminal as to whether the fitting is strong enough to bear the force of a predetermined level, by regulating the elasticity of the spring 111 to that level.

In the above embodiment, the cylindrical body 79, namely the tubular portion 85, the spacer portion 87 and the flange portion 89, is made not of a metallic material, but of a synthetic resin material such that a value of coefficient of friction is small and mechanical strength is prominent. In regard to the coefficient of friction, a preferred range for the synthetic resin material according to the present invention is less than or equal to 0.45, more preferably, less than or equal to 0.15 as determined by kinetic coefficient of friction. In regard to the mechanical strength, if it is judged according to Rockwell hardness, a range more than or equal to 32.5 is preferred. According to Izod impact strength (ASTM D 256), a range of more than or equal to 5 kg.cm/cm is suitable. Example of suitable synthetic resin materials satisfying the above conditions includes polyacetal [—O—CH$_2$—O—CH$_2$—]$_n$, fluorine plastics, SANFAIN U (UH-900, trade name, by ASAHI CHEMICAL INDUSTRY CO., LTD. of Chiyoda-ku, Tokyo, Japan) and the like. Of these materials, polyacetal is preferable.

For comparison of the preferred materials with other materials, common mechanical properties of brass, nylon 66 and polyacetal materials, for example, are shown in Table 1.

TABLE 1

| mechanical property | material | | |
| --- | --- | --- | --- |
| | brass | nylon 66 | polyacetal |
| kinetic coefficient of friction | 0.15 | 0.20 | 0.14 |
| Rockwell hardness (ASTM) | M32 | M83 | M78 |
| Izod impact strength | — | 2.5 | 7.5 |

From Table 1, it can be easily understood that polyacetal is greatly advantageous as the material for the cylindrical body 79, because it can realize both of low resistance against sliding motion of the front probe 81 and high durability at the same time. As a result, in the cylindrical body 79 made of polyacetal, smooth and quick motion of the front probe 81 can be realized, and it is also possible to prevent the cylindrical body and the metallic front probe 81 from being abrased to produce scrapings, such as metal powder, which causes incomplete contact between the front probe 81 and the rear probe 83. Accordingly, the electric resistance through the front and rear probes 81 and 83 can be easily maintained at a constant level. Therefore, the life span of the probe tester becomes longer and it is possible to solve the problem of measuring difficulty due to drastic change of electric resistance through the probe tester during the test.

Moreover, when the synthetic resin as illustrated above is employed for forming the cylindrical body 79, it is possible to integrally form the tubular portion 85 and the spacer portion 87 by integral molding. Accordingly, assembly of the spacer portion 87 on the tubular portion 85 is no longer required for the present invention. As a result, the spacer portion can be prevented from being eccentrically positioned relative to the inner bore of the tubular portion due to assembling difference. Therefore, motion of the front probe 81 is smooth, which also results in reduced abrasion and less damage of the spacer portion 87 and the bearing portion 107. Also, the difficult step of machining the bearing surface and the troublesome step of connecting the spacer portion to the tubular portion such that are necessary for manufacturing the conventional testing device are no longer necessitated for the probe tester of the present invention.

In the above-described embodiment, each of the probes 81 and 83, bearing surface 109 and the through hole 95 has a circular cross section. However, the shape of these cross sections is not limited to the above, and a cross section of other shape such as an oval, a rectangle, a perfect square, a rhombus, a hexagon, an octagon and an ellipse shape is also applicable in the present invention.

As mentioned above, it must be understood that the invention is in no way limited to the above embodiments and that many changes may be brought about therein without departing from the scope of the invention as defined by the appended claims.

What is claimed is:

1. A tester for testing a connector provided with at least one axial terminal hole and at least one terminal which is correspondingly fitted into said at least one terminal hole, having at least one probe unit which is moved with a movable body and adapted for corresponding introduction into said at least one terminal hole for testing the terminal, said at least one probe unit comprising:
   a tubular case fixed to the movable body, wherein the tubular case contains a support portion which is integrally formed with the tubular case inside the tubular case, the support portion has a coaxial hole which is narrower than an inner bore of the tubular case, and the movable probe is slidably supported on the coaxial hole;
   a movable probe and a fixed probe being made of an electrically conductive material and being aligned inside the tubular case, the fixed probe being fixed to and insulated from the tubular case and adapted for connecting to an output line, and the movable probe being slidably supported by the tubular case so as to move in an axial direction of the tubular case relative to the tubular case to connect to and disconnect from the fixed probe; and
   a regulator for regulating the movable probe to disconnect from the fixed probe when the corresponding terminal is not so firmly fitted to the corresponding terminal hole as fitting of the corresponding terminal can be sustained against a predetermined magnitude of force,
   wherein the tubular case is made of a synthetic resin material selected from the group consisting of polyacetal and fluorine plastics.

2. The tester as claimed in claim 1, wherein the tubular case is made of a synthetic resin material such that the value of kinetic coefficient of friction is less than about 0.15.

3. The tester as claimed in claim 1, wherein the regulator comprises a biasing device for biasing the movable probe to disconnect from the fixed probe and a portion of the movable probe to protrude from the tubular case so as to abut on the corresponding terminal by introduction of the probe unit into the corresponding terminal hole, and the corresponding terminal moves the protruding portion of the movable probe against the biasing device in response to abutting of the movable probe on the corresponding terminal.

4. The tester as claimed in claim 1, further comprises a receiving portion in which the connector to be tested is received, wherein the movable body can move to and from the connector received in the receiving portion in predetermined straight directions.

5. The tester as claimed in claim 4, further comprises:
   a handle by which motive power is supplied as rotational motion;
   a motion converter for converting the rotational motion supplied at the handle into straight motive power for moving the movable body to the connector received in the receiving portion; and
   a returning mechanism for moving the movable body away from the connector received in the receiving portion.

6. The tester as claimed in claim 5, wherein the motion converter includes a cam mechanism.

7. The tester as claimed in claim 6, wherein the cam mechanism includes a pair of cam plates which are connected to the handle to rotate with the handle and which pushes the movable body toward the receiving portion in accordance with rotation of the cam plate.

8. The tester as claimed in claim 4, wherein the tubular case is disposed on the movable body so that the axial direction of the tubular case is parallel to the predetermined straight directions.

9. A tester for testing a connector provided with at least one axial terminal hole and at least one terminal which is correspondingly fitted into said at least one terminal hole, having at least one probe unit which is moved with a movable body and adapted for corresponding introduction into said at least one terminal hole for testing the terminal, said at least one probe unit comprising:
   a tubular case fixed to the movable body, wherein the tubular case has a support portion being integrally formed with the tubular case inside the tubular case, the support portion has a coaxial hole which is narrower than an inner bore of the tubular case, and the movable probe is slidably supported on the coaxial hole;
   a movable probe and a fixed probe being made of an electrically conductive material and being aligned inside the tubular case, the fixed probe being fixed to the tubular case and insulated from the tubular case and adapted for connecting to an output line, and the movable probe being slidably supported by the tubular case so as to move in an axial direction of the tubular case relative to the tubular case to connect to and disconnect from the fixed probe; and
   a regulator for regulating the movable probe to disconnect from the fixed probe when the corresponding terminal is not so firmly fitted to the corresponding terminal hole as fitting of the corresponding terminal can be sustained against a predetermined magnitude of force, wherein the tubular case is made of a synthetic resin material such that the value of kinetic coefficient of friction is less than about 0.15, the value of Izod impact strength is greater than about 5 kg.cm/cm, and the value of Rockwell hardness is less than about 32.5.

10. The tester as claimed in claim 9, wherein the regulator comprises a biasing device for biasing the movable probe to disconnect from the fixed probe and a portion of the movable probe to protrude from the tubular case so as to abut on the corresponding terminal by introduction of the probe unit into the corresponding terminal hole, and the corresponding terminal moves the protruding portion of the movable probe against the biasing device in response to abutting of the movable probe on the corresponding terminal.

11. The tester as claimed in claim 9, further comprises a receiving portion in which the connector to be tested is received, wherein the movable body can move to and from the connector received in the receiving portion in predetermined straight directions.

12. The tester as claimed in claim 11, further comprises:

a handle by which motive power is supplied as rotational motion;

a motion converter For converting the rotational motion supplied at the handle into straight motive power for moving the movable body to the connector received in the receiving portion; and a returning mechanism for moving the movable body away from the connector received in the receiving portion.

13. The tester as claimed in claim 12, wherein the motion converter includes a cam mechanism.

14. A tester for testing a connector provided with at least one axial terminal hole and at least one terminal which is correspondingly fitted into said at least one terminal hole, having at least one probe unit which is moved with a movable body and adapted for corresponding introduction into said at least one terminal hole for testing the terminal, said at least one probe unit comprising:

a tubular case fixed to the movable body;

a movable probe and a fixed probe being made of an electrically conductive material and being aligned inside the tubular case, the fixed probe being fixed to the tubular case and insulated from the tubular case and adapted for connecting to an output line, and the movable probe being slidably supported by the tubular case so as to move in an axial direction of the tubular case relative to the tubular case to connect to and disconnect from the fixed probe;

a receiving portion in which the connector to be tested is received, wherein the movable body can move to and from the connector received in the receiving portion in predetermined straight directions;

a handle by which motive power is supplied as rotational motion;

a motion converter for converting the rotational motion supplied at the handle into straight motive power for moving the movable body to the connector received in the receiving portion, wherein the motion converter includes a cam mechanism;

a returning mechanism for moving the movable body away from the connector received in the receiving portion; and a regulator for regulating the movable probe to disconnect from the fixed probe when the corresponding terminal is not so firmly fitted to the corresponding terminal hole as fitting of the corresponding terminal can be sustained against a predetermined magnitude of force, wherein the tubular case has a support portion being integrally formed with the tubular case inside the tubular case, the support portion has a coaxial hole which is narrower than an inner bore of the tubular case, and the movable probe is slidably supported on the coaxial hole.

15. The tester as claimed in claim 14, wherein the regulator comprises a biasing device for biasing the movable probe to disconnect from the fixed probe and a portion of the movable probe to protrude from the tubular case so as to abut on the corresponding terminal by introduction of the probe unit into the corresponding terminal hole, and the corresponding terminal moves the protruding portion of the movable probe against the biasing device in response to abutting of the movable probe on the corresponding terminal.

16. The tester as claimed in claim 1, wherein the tubular case is made of a synthetic resin material such that the value of Rockwell hardness is greater than about 32.5.

17. The tester as claimed in claim 1, wherein the tubular case is made of a synthetic resin material such that the value of Izod impact strength is greater than about 5 kg.cm/cm.

18. The tester as claimed in claim 5, wherein the support portion is integrally formed with the tubular case by using a resin material.

19. The tester as claimed in claim 14, wherein the tubular case is made of a synthetic plastic resin material including polyacetal.

20. The tester as claimed in claim 14, wherein the tubular case is made of a synthetic plastic resin material including fluorine.

* * * * *